United States Patent [19]

Rouger et al.

[11] Patent Number: 4,835,498

[45] Date of Patent: May 30, 1989

[54] TUNABLE MICROWAVE FILTERING DEVICE WITH DIELECTRIC RESONATOR, AND APPLICATIONS

[75] Inventors: Jean-Michel Rouger, Issy les Moulineaux; Gilles Denis, Versailles; Bernard Liabeuf, Montrouge, all of France

[73] Assignee: Thomson-CSF, Paris, France

[21] Appl. No.: 202,578

[22] Filed: Jun. 6, 1988

[30] Foreign Application Priority Data

Jun. 9, 1987 [FR] France .................. 87 08004

[51] Int. Cl.⁴ .............. H01P 1/203; H01P 7/10; H03D 9/02; H03B 518
[52] U.S. Cl. .................. 333/205; 329/116; 329/160; 331/107 DP; 331/107 SL; 333/219.1; 333/235
[58] Field of Search .............. 333/202, 204, 205, 219, 333/219.1, 246, 235, 222, 223; 331/96, 101, 107 DP, 107 SL, 117; 329/116, 120

[56] References Cited

U.S. PATENT DOCUMENTS

| 4,146,896 | 0/0000 | Baril et al. .................. 333/204 X |
| 4,511,860 | 4/1985 | Bastida et al. ............ 331/107 SL |
| 4,514,707 | 4/1985 | Dydyk et al. ............. 331/107 SL |
| 4,654,606 | 3/1987 | Tadachi .................... 333/219.1 |
| 4,714,906 | 12/1987 | D'Albaret et al. ........... 333/235 X |

FOREIGN PATENT DOCUMENTS

| 69431 | 1/1983 | European Pat. Off. . |
| 190613 | 8/1986 | European Pat. Off. . |
| 2438937 | 5/1990 | France . |

Primary Examiner—Marvin L. Nussbaum
Attorney, Agent, or Firm—Oblon, Fisher, Spivak, McClelland & Maier

[57] ABSTRACT

A tunable, microwave filtering device comprises a microstrip line, a dielectric resonator capable of being coupled to the microstrip line, a coplanar line capable of being coupled to the resonator, an active element, such as a varactor for example, mounted on the coplanar line, the variable impedance of which enables the frequency tuning of the device. The invention can be applied to the making of a tunable microwave frequency discriminator, the making of a microwave oscillator and the frequency stabilization of a tunable oscillator.

8 Claims, 5 Drawing Sheets

TUNABLE MICROWAVE FILTERING DEVICE WITH DIELECTRIC RESONATOR, AND APPLICATIONS

BACKGROUND OF THE INVENTION

1. Field of the Invention

The present invention concerns a filtering or frequency selection device, designed to process microwaves, a device that operates by coupling between at least one dielectric resonator and at least one transmission line such as, for example a microstrip line. This device may be frequency tuned by an electronic control. It is applied, especially, to the making of a tunable oscillator as well to the making of a tunable frequency discriminator which can be used in a device for the frequency stabilization of a tunable oscillator.

For certain uses of a device of this type, for example for radar system equipment, it is necessary to make a device which has frequency agility, which can be tuned to a wide freqency band and, in addition, has high tuning speed. To be fitted to an airborne or homing radar system, a device of this type must also be as small and as light as possible.

2. Description of the Prior Art

Devices of this type are known. One such known device has:

two microstrip lines;

a dielectric resonator located on the substrate constituting the dielectric of the said lines (hereinafter designated simply as the substrate) and close enough to these lines to be coupled to each of them:

a varactor, i.e. a capacitor capable of variation according to the voltage applied to its terminals, mounted on one of the lines.

A signal injected into the device is filtered, and the obtained center frequency of the filtering device can be made to vary by controlling the voltage applied to the varactor.

However, this known device is tunable only on a band which is small as compared, for example, with a filtering device having a YIG resonator.

SUMMARY OF THE INVENTION

According to the present invention, it is proposed to replace one of the microstrip lines with a coplanar line and to mount the varactor on the coplanar line.

As compared with the prior art device, the device according to the invention can be tuned to a far wider frequency band: the coupling between the resonator and the line bearing the varactor is more intense (the line on which the varactor is mounted has a different nature).

More precisely, an object of the invention is a tunable microwave filtering device comprising:

a first microstrip line;

a dielectric resonator coupled to said first microstrip line;

an active element coupled to said dielectric resonator, the variable impedance of said active element enabling the frequency tuning of the device;

a coplanar line coupled to said resonator, the active element being mounted on said coplanar line.

BRIEF DESCRIPTION OF THE DRAWINGS

Special features, various embodiments and various applications of the device according to the invention will appear more clearly from the following description, made with reference to the appended figures, of which.

These various figures have not been drawn to scale. Moreover, the same references are repeated for the same elements.

DESCRIPTION OF THE PREFERRED EMBODIMENTS

In the following description it will be assumed, as an example, that the part of the signal, injected into the device and liable to be processed, corresponds to a TE mode, for example the $TE_{018}$ mode. The coupling among the various elements of the device is then magnetic and occurs chiefly in a zone where the amplitude of the magnetic fields of the different coupled elements is high.

Figure 1:
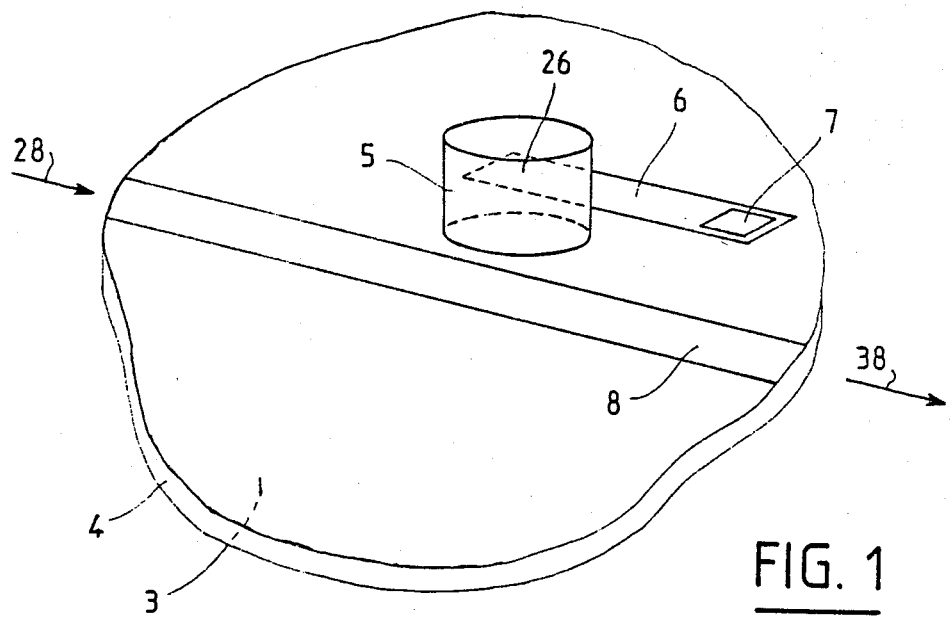
FIG. 1 shows a perspective view of a known device.
Figure 2:
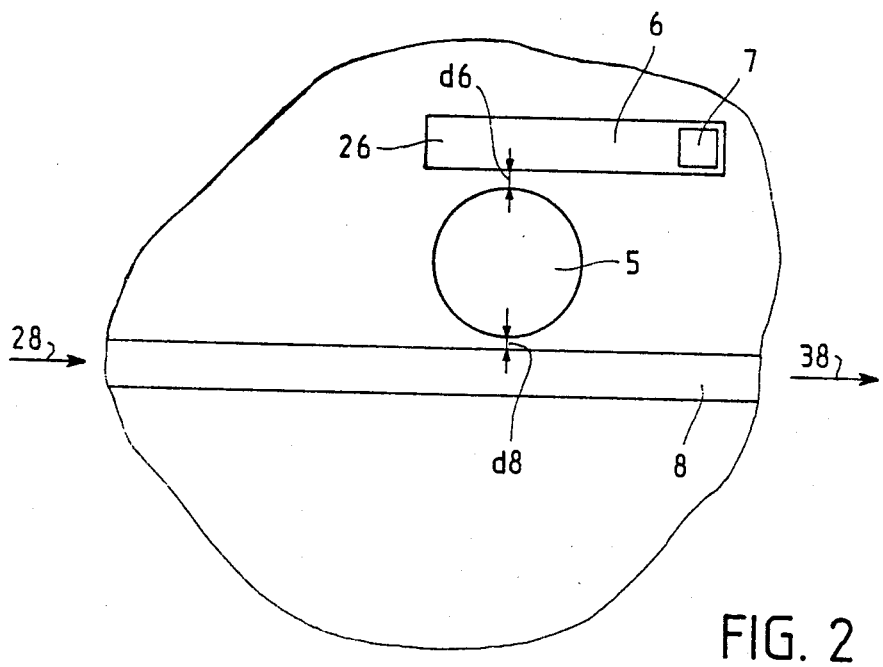
FIG. 2 shows a top view of the device of FIG. 1.

A known device is shown in FIG. 1 and 2 where it is seen in a perspective view and a top view respectively.

This known device has two parallel microstrip lines 8 and 6 having a common dielectric substrate 4 and a common ground plate 3. The line 6 has an open circuit end 26. A cylindrical, dielectric resonator 5 is located between these two lines 8 and 6, on the substrate of said lines. This resonator 5 is located at distances $d_8$ and $d_6$ respectively from the lines 8 and 6 respectively. The distances $d_8$ and $d_6$ are small enough for magnetic coupling to be possible between, firstly, the elements 5 and 8 and, secondly, the elements 5 and 6. A varactor 7 is mounted on the end opposite to the end 26 of line 6.

A microwave signal injected into the input 28 of the line 8, and recovered at the output 38 of this same line, is filtered. The known device is tunable as explained above.

Figure 3:
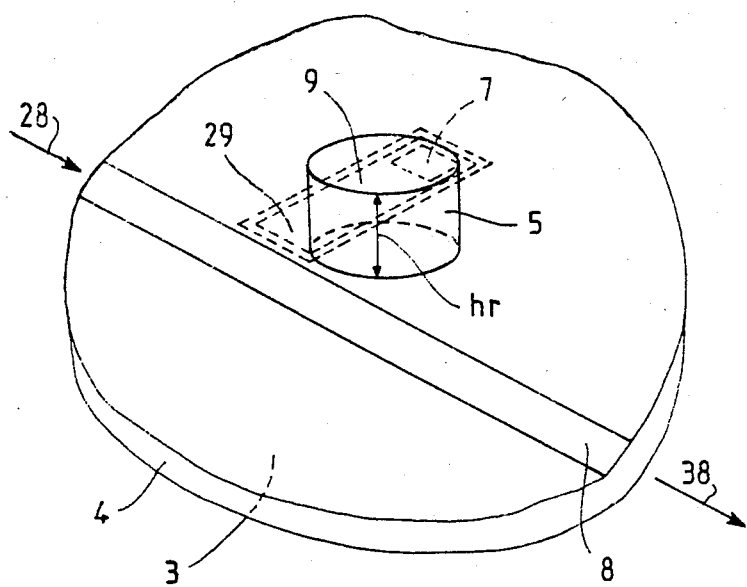
FIG. 3 shows a perspective view of a first embodiment of the device according to the invention.
Figure 4:
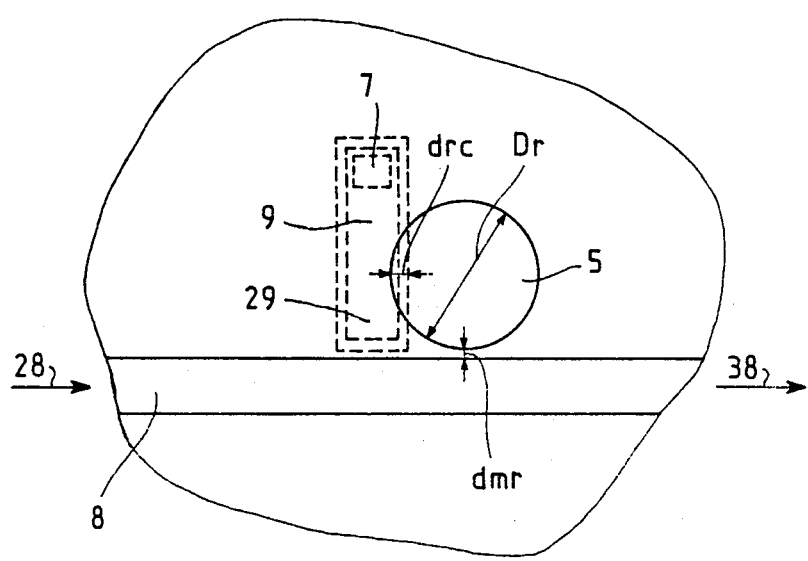
FIG. 4 shows a top view of the device of FIG. 3.

FIGS. 3 and 4 respectively show a perspective view and a top view of a first embodiment of the device according to the invention. A cylindrical, dielectric resonator 5, the dimensions of which approximately correspond to the wavelength injected into the device, is placed near a microstrip line 8, on the substrate of this microstrip line, at a distance $d_{mr}$ (between the microstrip line and the resonator) small enough for coupling to be possible between the elements 5 and 8.

The elements 5 and 8 constitute a filtering device, the resonance frequency of which can be controlled by means of an electronic circuit comprising a coplanar line 9 made on the metallized side of the substrate 4 which constitutes the ground plate 3 of the microstrip and coplanar lines, and a varactor 7 mounted on the line 9. This line 9 is substantially perpendicular to the line 8, and has an open circuit end 29, the varactor 7 being mounted on the other end of the line 9.

The position of the line 9 with respect to the resonator 5 is represented in FIG. 4 by the distance $d_{rc}$, measured in a plane which is substantially parallel to the sides of the dielectric 4. This distance $d_{rc}$ is such that a coupling between the line 9 and the resonator 5 is possible: according to the enbodiment shown in FIGS. 3 and 4, the line 9 is partially beneath the resonator 5 and the distance $d_{rc}$ actually measures the overlapping between the elements 9 and 5, located in substantially parallel planes. However, a coupling between the elements 9 and 5 can take place without this overlapping, i.e. when the line 9 is not at all beneath the resonator 5, but is still close to this resonator 5.

Furthermore, according to the embodiment being considered, the line 9 does not go beneath the line 8. However, it is possible to make a device according to the invention, similar to that of FIGS. 3 and 4, comprising a line 9 that goes beneath the line 8 and even goes beyond this line 8.

In transmission, the device of FIGS. 3 and 4 behaves like a band rejection filter: a microwave signal injected into the input 28 of line 8 and recovered at the output 38 of this same line has its characteristics modified by an interaction between the magnetic fields resulting from the excitation of the resonator 5 and the fields associated with the line 8. The resonance frequency of the device can be made to vary by controlling the voltage V applied to the terminals of the varactor 7 through magnetic coupling between the resonator 5 and the line 9. The tuning band of the device is all the wider as the coupling between the varactor 7 and the resonator 5 is intense.

The characteristics of the device such as, for example, its speed and tuning band, depend on the following parameters:

the permittivity of the material constituting the resonator 5, the diameter $D_r$ and height $h_r$ of this resonator;

the permittivity and thickness of the substrate 4;

the dimensions of the lines 9 and 8;

the arrangement of the different elements, given especially by the distances $d_{mr}$ and $d_{rc}$, and the position of the lines 9 and 8 with respect to each other;

the characteristics of the varactor.

Figure 5:
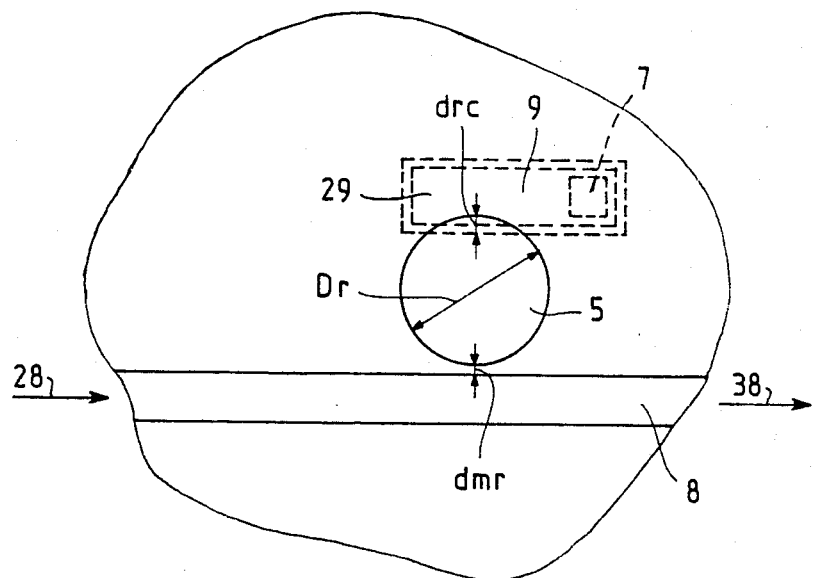
FIG. 5 shows a top view of a second embodiment of the device according to the invention.

FIG. 5 shows a top view of a secong embodiment of the device according to the invention which differs from the first embodiment only in the position of line 9. This line 9 is substantially parallel to line 8. The description with reference to FIG. 5 is similar to that made with reference to FIGS. 3 and 4, except as regards the relative position of the elements 8 and 9 which is fixed by the distances $d_{mr}$ and $d_{rc}$. However, the configuration of the elements of FIG. 5 is less "adaptable" than that corresponding to FIGS. 3 and 4, for the position and dimensions of the lines 9 and 8 impose greater limits on the choice of the diameter and position of the resonator 5 in the case of FIG. 5 than in that of FIGS. 3 and 4. In other words, the parameters on which the characteristics of the device depend are more correlated in the second embodiment than in the first one.

Figure 6:
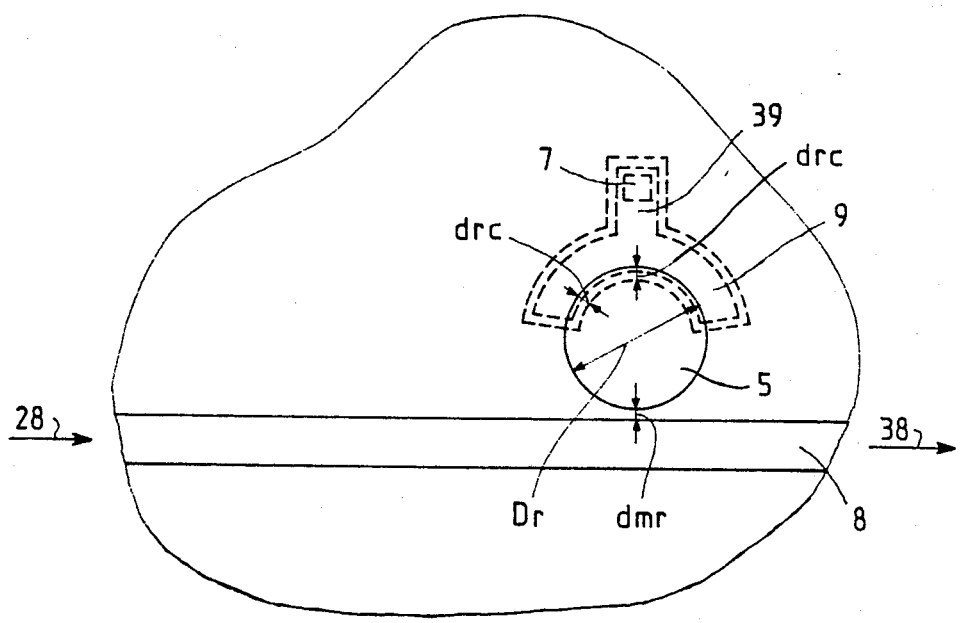
FIG. 6 shows a top view of a third embodiment of the device according to the invention.

FIG. 6 shows a top view of a third embodiment of the device according to the invention which differs from the second embodiment in the shape of the line 9. This line 9 is curved and partially surrounds the resonator 5: the elements 9 and 5 are concentric, and the line 9 forms an arc of a circle, partly located beneath the resonator 5 but not at all beneath the line 8. The line 9 further has a protrusion 39 which is substantially perpendicular to the direction of the line 8, on which the varactor 7 is mounted. The description made with reference to FIG. 6 is similar to that with reference to FIG. 5, except as regards the end 29 and the protrusion 39.

Figure 7:
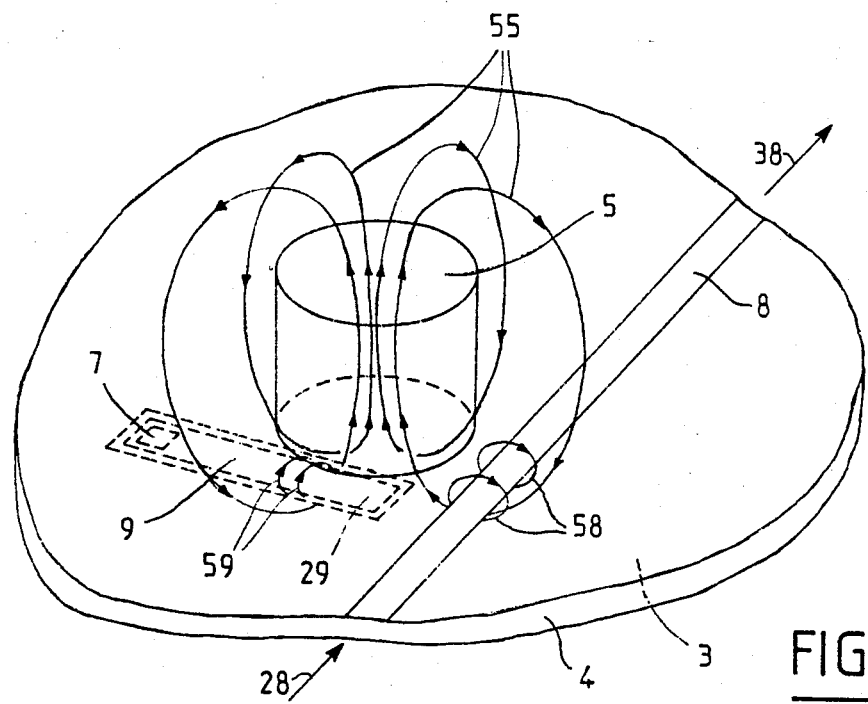
FIG. 7 illustrates the magnetic coupling among the elements of the device shown in FIG. 3 and FIG. 4.

FIG. 7 illustrates the magnetic coupling among the various elements of the device of FIGS. 3 and 4, by showing the magnetic field lines (55, 58, 59) associated with the various elements liable to be coupled. The similarity between the field lines 55, associated with the resonator 5, and the field lines 58, associated with the microstrip line 8, ensures efficient coupling between the elements 5 and 8. Similarly, the similarity between the field lines 55, associated with the resonator 5, and the field lines 59, associated with the coplanar line 9, ensures efficient coupling between the elements 5 and 9.

Figure 8:
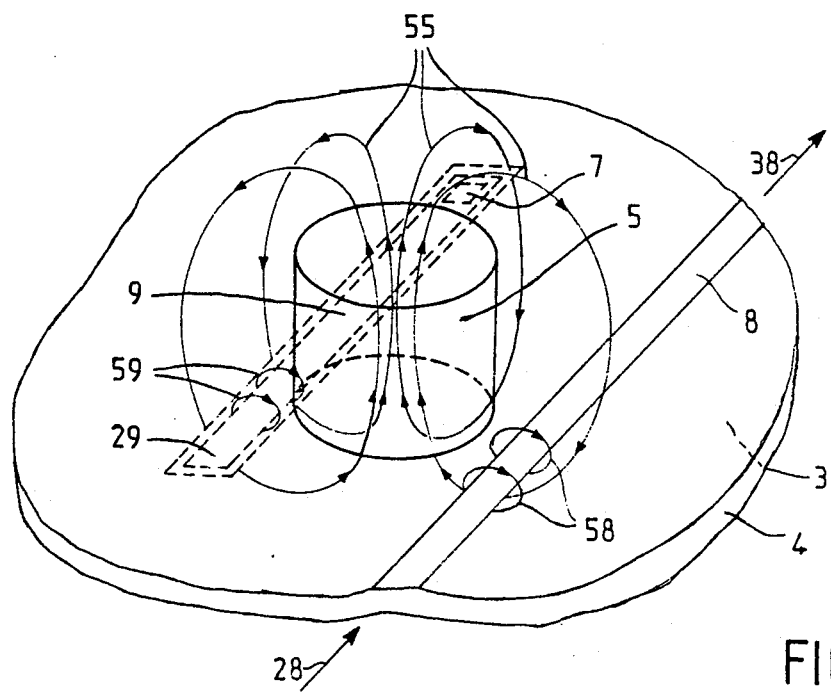
FIG. 8 shows the magnetic coupling among the elements of FIG. 5.

FIG. 8 is analogous to FIG. 7, but pertains to the configuration of FIG. 5. The description of FIG. 8 is similar to that of FIG. 7.

Figure 9:
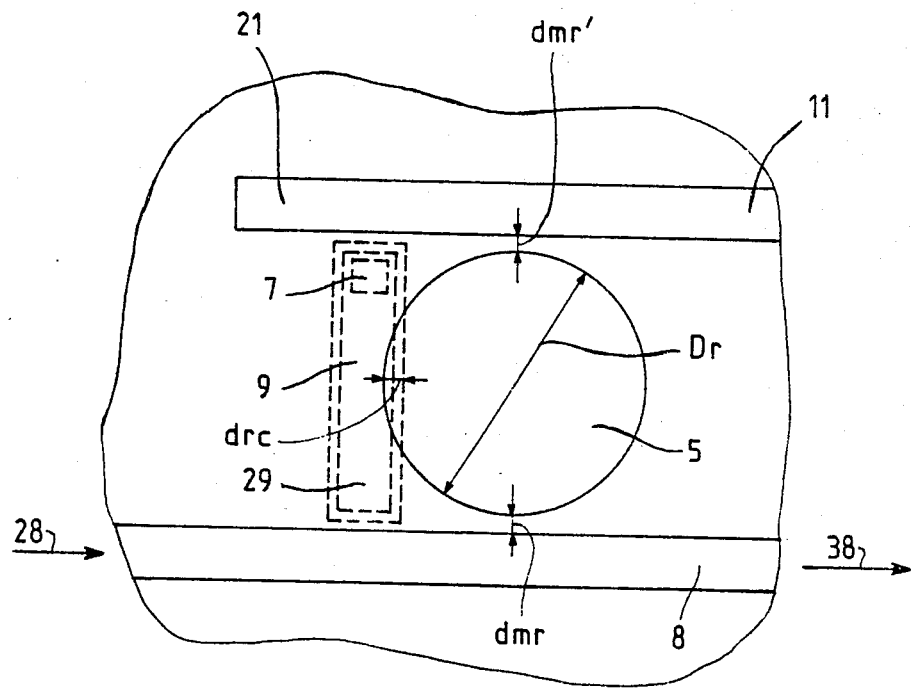
FIG. 9 shows a top view of a fourth embodiment of the device according to the invention.

FIG. 9 shows a top view of the fourth embodiment according to the invention, comprising all the elements of FIG. 3 and 4 and further comprising a microstrip line 11, called a secondary microstrip line, the substrate and ground plate of which are those of the lines 8 and 9. The line 11 comprises an open circuit end 21. This line 11 is located at the distance $d_{mr'}$ from the resonator. This distance $d_{mr'}$ is chosen according to the same criterion as the distance $d_{mr}$. In the enbodiment considered, the line 9 does not go beneath the line 11. It is, however, possible to make a device according to the invention, similar to that shown in FIG. 9, with a line 9 that goes beneath the line 11 and even goes beyond this line 11.

The elements of FIG. 9, which are also shown in FIGS. 3 and 4, form a set which behaves, in transmission, like a band rejection filter, as explained earlier. That part of the signal, which is injected into the input 28 of the line 8 and corresponds to the frequency band rejected by the coupling between the line 8 and the resonator 5, goes into the line 11 after having been modified by a magnetic interaction between the resonator 5 and the line 11. In other words, the secondary line 11 constitutes, for a microwave signal injected into the input 28 of line 8, the output of a pass-band filter insofar as the output impedances of lines 8 and 11 are respectively substantially equal to their characteristic impedances, such as, for example equal to 50Ω. The device of FIG. 9 is tunable, and tuning of this kind is obtained by controlling the voltage V applied to the varactor 7.

When the device of FIGS. 3 and 4 or 5 or 6 is associated, for example as a tunable feed-back device, with another microwave circuit displaying a negative resistance, for example with a microwave transistor, it is capable of constituting a compact, tunable, dielectric microwave oscillator with dielectric resonator, having a tuning band which is substantially wider than that of known oscillators of the same type. The choice of the voltage V enables the selection of the center frequency of the signal generated by the oscillator.

The device of FIG. 9 enables the making of a microwave frequency discriminator, for which the frequency-amplitude conversion curve (hereinafter called the "frequency-amplitude characteristic") is similar to the one of a Travis discriminator commonly used for lower frequencies, said discriminator in addition, being tunable in frequency, i.e. having a frequency-amplitude characteristic capable of being shifted in frequency. In addition to the device of FIG. 9, the discriminator according to the invention has a diode detection device which is connected to the outputs of lines 8 and 11, and which combines in opposition the output signals, such a combination being known by the man skilled in the art for making Travis discriminators. In such case, the connection of the diode detection device to the outputs of lines 8 and 11 results in a distorsion of the frequency response curve at the output of line 11, said distortion enables to obtain the known frequency-amplitude characteristic of a discriminator, which is symmetrical with respect to the point corresponding to the central frequency of said discriminator. Furthermore, the discriminator according to the invention is tunable: varying the voltage applied to the varactor 7 shifts in frequency the frequency-amplitude characteristic.

A tunable discriminator, such as the one described in the above paragraph, can be applied to the frequency stabilization of a tunable oscillator such as, for example, an oscillator with dielectric resonator, which has been described above and has the device of FIGS. 3 and 4 or 5 or 6. The discriminator is then integrated into a frequency locking loop and, in particular, enables a notable reduction in the phase noise of the oscillator throughout the tuning band of this oscillator. Since the discriminator is tunable, its frequency-amplitude characteristic may have a steep slope (in terms of absolute value) and may thus greatly compress the said noise, the tuning band of the discriminator being obviously determined so that the frequence-amplitude characteristic of this discriminator can be shifted throughout the frequency range corresponding to the matching band of the oscillator. A reduction in the phase noise of an oscillator throughout its tuning band could also be obtained with a non-tunable discriminator, the frequency-amplitude characteristic of which would cover the entire tuning band of the oscillator, but the slope of a characteristic of this type would be small: the compression of the said noise would therefore be small.

Other embodiments of the device according to the invention, and other applications may be obtained by modifying at least one of the following factors:
the number of microstrip lines;
the number of dielectric resonators;
the number of coplanar lines;
the number of varactors;
the geometry of the different elements while, at the same time, preserving the nature of the couplings, namely by preserving the position, with respect to the dielectric, of the microstrip lines and the dielectric resonators, on the one hand, and of the coplanar lines and the varactors on the other.

For example, an extension of the embodiment of FIG. 8, obtained by adding secondary microstrip lines 11 and, between the, resonators 5, as well as corresponding coplanar lines and varactors, would come within the scope of the invention.

What is claimed is:.

1. A tunable microwave filtering device comprising:
a first microstrip line comprising a ground plate;
a dielectric resonator coupled to said microstrip line;
an active element coupled to said dielectic resonator, the variable impedance of said active element enabling the frequency tuning of the device;
a coplanar line cut up in said ground plate and coupled to said resonator, the active element being mounted on said coplanar line.

2. A device according to claim 1 wherein the active element is a varactor to which a variable voltage is applied, this variation enabling the modification of the impedance of the varactor.

3. A device according to claim 2 wherein:
said dielectric resonator is located beside said first microstrip line;
said coplanar line, is substantially perpendicular to said first microstrip line and is located near said resonator, the device obtained constituting, in transmission, a tunable, band rejection filter.

4. A device according to claim 2 wherein:
said dielectric resonator is located beside said first microstrip line;
said coplanar line, said ground is substantially parallel to said first microstrip line and located near said resonator,
the device obtained constituting, in transmission, a tunable, band rejection filter.

5. A device according to claim 3 further comprising a second microstrip line substantially parallel to said first microstrip line, the device thus obtained constituting:
in transmission, a tunable band rejection filter,
for a signal injected along said first microstrip line and going out through said second microstrip line, a tunable pass-band filter.

6. Tunable microwave oscillator with dielectric resonator, said oscillator comprising a device as in any one of claims 1–4.

7. Filtering device according to claim 3 further comprising:
a second microstrip line, substantially parallel to said first microstrip line, substantially parallel to said first microstrip line, and coupled to said resonator;
the output signals of the first and of the second microstrip lines being combined by diode detection means in such a way that a frequency-amplitude characteristic of a discriminator may be obtained.

8. Tunable microwave oscillator, stabilized in frequency by a tunable discriminator, said oscillator comprising;
a first microstrip line comprising a ground plate;
a dielectric resonator coupled to and located beside said first microstrip line;
a coplanar line, cut up in said ground plate, substantially perpendicular to said first microstrip line, and coupled to located near said resonator;
a varactor mounted on said coplanar line, to which a variable voltage is applied, such a variation of voltage enabling the frequency tuning of said filtering device;
a second microstrip line, substantially parallel to said first microstrip line and coupled to said resonator;
diode detection means combining the output signals of said first and second microstrip lines, in such a way that a frequency amplitude characteristic of a discriminator may be obtained;
so as to enable the stabilization of the oscillator throughout the tuning band of said oscillator by means of a shift in frequency of the frequency-amplitude characteristic of said discriminator, said shift in frequency of said characteristic being obtained through the control of the voltage applied to said varactor.

* * * * *